US011127693B2

(12) United States Patent
Gatterbauer et al.

(10) Patent No.: US 11,127,693 B2
(45) Date of Patent: Sep. 21, 2021

(54) BARRIER FOR POWER METALLIZATION IN SEMICONDUCTOR DEVICES

(71) Applicant: Infineon Technologies AG, Neubiberg (DE)

(72) Inventors: Johann Gatterbauer, Parsberg (DE); Katrin Albers, Regensburg (DE); Joerg Busch, Regensburg (DE); Klaus Goller, Regensburg (DE); Norbert Mais, Munich (DE); Marianne Kolitsch, Villach (AT); Michael Nelhiebel, Villach (AT); Rainer Pelzer, Wernberg (AT); Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 104 days.

(21) Appl. No.: 16/710,044

(22) Filed: Dec. 11, 2019

(65) Prior Publication Data

US 2020/0111754 A1    Apr. 9, 2020

Related U.S. Application Data

(63) Continuation-in-part of application No. 16/418,006, filed on May 21, 2019, now Pat. No. 10,700,019, (Continued)

(51) Int. Cl.
*H01L 23/00* (2006.01)
*B81B 7/00* (2006.01)
*H01L 23/58* (2006.01)

(52) U.S. Cl.
CPC .......... *H01L 23/562* (2013.01); *B81B 7/0006* (2013.01); *H01L 23/585* (2013.01);
(Continued)

(58) Field of Classification Search
CPC ..... H01L 23/562; H01L 23/585; H01L 24/11; H01L 24/13; H01L 2224/1132;
(Continued)

(56) References Cited

U.S. PATENT DOCUMENTS 4,988,423 A * 1/1991 Yamamoto ........ H01L 21/76877
 204/192.17
5,578,522 A 11/1996 Nakamura et al.
(Continued)

FOREIGN PATENT DOCUMENTS

DE 102004059389 A1 6/2006
DE 102006052202 B3 2/2008
(Continued)

OTHER PUBLICATIONS

Joshi, Ravi, et al., "Power Metallization Structure for Semiconductor Devices", U.S. Appl. No. 16/048,667, filed Jul. 30, 2018.

*Primary Examiner* — Jami Valentine Miller
(74) *Attorney, Agent, or Firm* — Murphy, Bilak & Homilier, PLLC

(57) ABSTRACT

A semiconductor device includes a structured interlayer on a substrate, a structured power metallization on the structured interlayer, and a barrier on the structured power metallization. The barrier is configured to prevent diffusion of at least one of water, water ions, sodium ions, potassium ions, chloride ions, fluoride ions, and sulphur ions towards the structured power metallization. A first defined edge of the structured interlayer faces the same direction as a first defined edge of the structured power metallization and extends beyond the first defined edge of the structured power metallization by at least 0.5 microns. The structured interlayer has a compressive residual stress at room temperature and the structured power metallization generates a tensile stress at room temperature that is at least partly counteracted by the compressive residual stress of the structured inter-
(Continued)

layer. The first defined edge of the structured power metallization has a sidewall which slopes inward.

20 Claims, 14 Drawing Sheets

Related U.S. Application Data which is a continuation of application No. 15/686,576, filed on Aug. 25, 2017, now Pat. No. 10,304,782.

(52) U.S. Cl.
CPC .............. *H01L 24/11* (2013.01); *H01L 24/13* (2013.01); *H01L 2224/1132* (2013.01); *H01L 2224/1162* (2013.01); *H01L 2224/11614* (2013.01); *H01L 2224/13017* (2013.01); *H01L 2224/13082* (2013.01); *H01L 2224/13124* (2013.01); *H01L 2224/13144* (2013.01); *H01L 2224/13147* (2013.01); *H01L 2224/13166* (2013.01); *H01L 2224/13184* (2013.01); *H01L 2924/1033* (2013.01); *H01L 2924/10253* (2013.01); *H01L 2924/10272* (2013.01); *H01L 2924/3512* (2013.01)

(58) Field of Classification Search
CPC ... H01L 2224/11614; H01L 2224/1162; H01L 2224/13017; H01L 2224/13082; H01L 2224/13124; H01L 2224/13144; H01L 2224/13147; H01L 2224/13166; H01L 2224/13184; H01L 2924/10253; H01L 2924/10272; H01L 2924/1033; H01L 2924/3512; B81B 7/0006
USPC ........................................................ 257/737
See application file for complete search history.

(56) References Cited

U.S. PATENT DOCUMENTS

| | | | |
|---|---|---|---|
| 6,020,640 A | 2/2000 | Efland et al. | |
| 6,362,525 B1 | 3/2002 | Rahim | |
| 6,544,880 B1 | 4/2003 | Akram | |
| 6,576,539 B1 | 6/2003 | Lin | |
| 7,071,537 B2 | 7/2006 | Kelberlau et al. | |
| 7,122,902 B2 | 10/2006 | Hatano et al. | |
| 9,196,560 B2 | 11/2015 | Roth et al. | |
| 9,397,022 B2 | 7/2016 | Roth et al. | |
| 9,831,206 B2 | 11/2017 | Raravikar et al. | |
| 10,304,782 B2 | 5/2019 | Mataln et al. | |
| 2001/0036804 A1* | 11/2001 | Mueller | B24D 3/34 451/526 |
| 2002/0149118 A1 | 10/2002 | Yamaguchi et al. | |
| 2002/0149958 A1* | 10/2002 | Kunikiyo | H01L 27/115 365/51 |
| 2003/0183913 A1 | 10/2003 | Robl et al. | |
| 2005/0179068 A1 | 8/2005 | Rueb et al. | |
| 2005/0239277 A1 | 10/2005 | Mercer et al. | |
| 2005/0258484 A1 | 11/2005 | Itou | |
| 2007/0222087 A1 | 9/2007 | Lee et al. | |
| 2007/0228543 A1 | 10/2007 | Walter et al. | |
| 2008/0001162 A1 | 1/2008 | Hackenberger et al. | |
| 2008/0254600 A1 | 10/2008 | Liu et al. | |
| 2010/0207237 A1 | 8/2010 | Yao et al. | |
| 2010/0314725 A1 | 12/2010 | Gu et al. | |
| 2012/0235278 A1 | 9/2012 | Shigihara et al. | |
| 2013/0203214 A1* | 8/2013 | Isobe | H01L 21/47573 438/104 |
| 2014/0061823 A1 | 3/2014 | Kam et al. | |
| 2015/0115391 A1 | 4/2015 | Roth et al. | |
| 2015/0348987 A1* | 12/2015 | Lee | H01L 27/11573 257/326 |
| 2016/0268184 A1 | 9/2016 | Hirano et al. | |
| 2017/0098620 A1 | 4/2017 | Roth et al. | |
| 2018/0145045 A1 | 5/2018 | Zundel et al. | |
| 2018/0350760 A1 | 12/2018 | Usami | |

FOREIGN PATENT DOCUMENTS

| | | |
|---|---|---|
| DE | 102010061189 A1 | 6/2011 |
| DE | 102012109995 A1 | 4/2014 |
| DE | 102015219183 A1 | 4/2017 |
| DE | 102016122318 A1 | 5/2018 |
| JP | H01309340 A | 12/1989 |
| WO | 2016024946 A1 | 2/2016 |

* cited by examiner

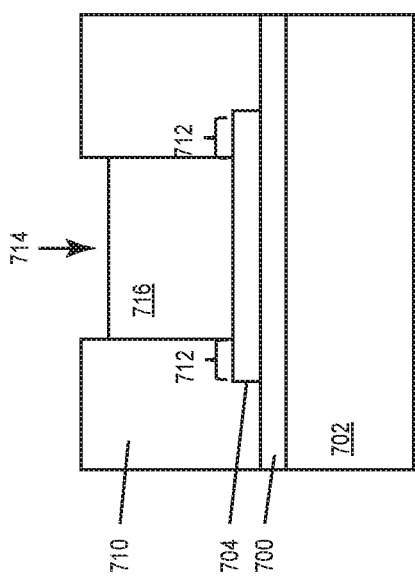
*Figure 8D*
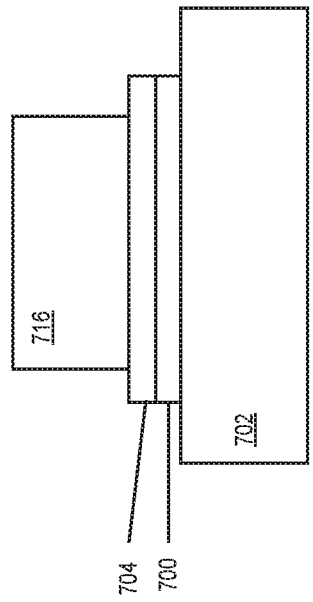
*Figure 8E*
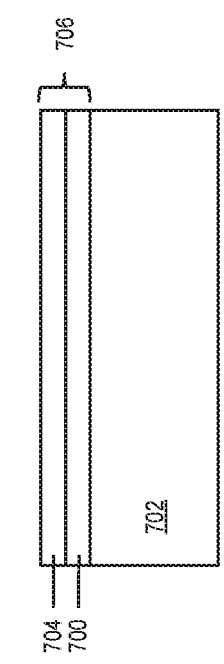
*Figure 8A*
*Figure 8B*
*Figure 8C*

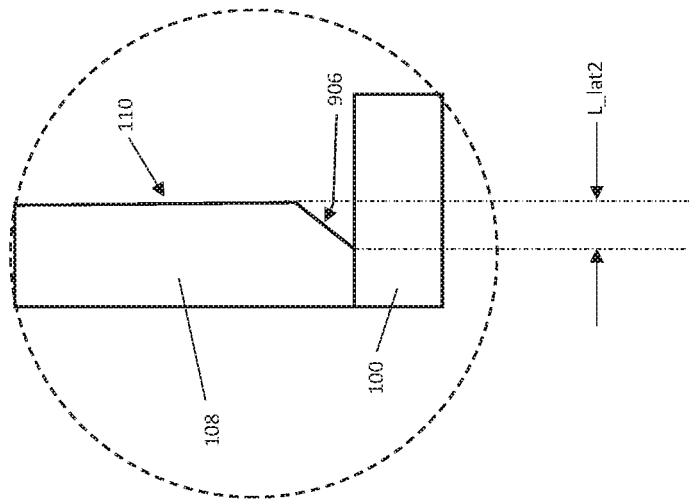
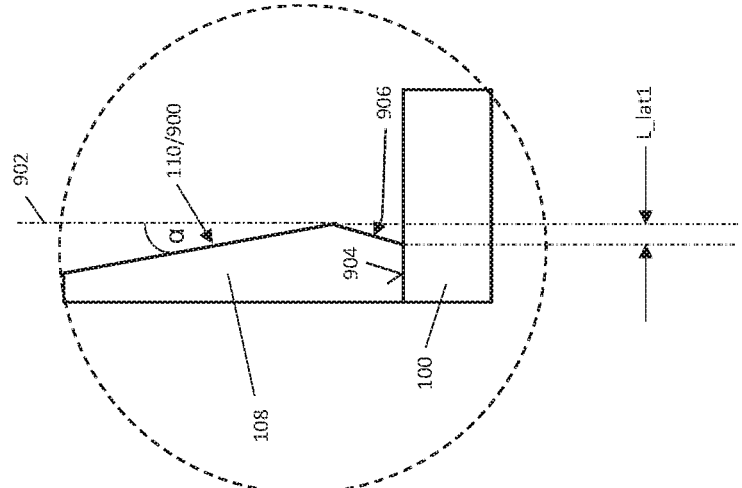
Figure 9B

BARRIER FOR POWER METALLIZATION IN SEMICONDUCTOR DEVICES

TECHNICAL FIELD

The present application relates to semiconductor devices, in particular preventing crack propagation from metallization edges of a semiconductor device.

BACKGROUND

When thick (e.g. >5 μm) and stiff (high E-modulus/high yield stress) metallization stacks such as thick Cu, Al or Au power metals are introduced into a semiconductor device e.g. to enable particular interconnect solutions or improve thermal performance, high stresses occur near any film-terminating free-edge of the metal layer as a result of any sufficiently large temperature change. Such stresses occur due to the mismatch in the coefficients of thermal expansion (CTE) between the metal film and the underlying substrate (e.g. semiconductor materials or interlevel dielectrics). Temperature changes can occur during device processing (e.g. during cool-down to room temperature after an annealing step) or during use of the final device (e.g. power dissipation during switching operation under overload conditions). Free edges are created by the requirement of a patterned power metallization having defined lines and plates of limited size.

Whenever tensile stresses occur below the metal edge and hence in the substrate (e.g. SiO2- or Si3N4-based interlevel dielectrics, or the semiconductor substrate itself), cracks can result in the underlying brittle layers. This is in general the case during cool-down phases, e.g. from annealing at typically 400° C. down to room-temperature, if the CTE of the film is larger than that of the substrate, which is practically always the case.

To avoid cracks during production, either the temperature budget is reduced after deposition of the metal (e.g., to 300° C. anneal), or metals with reduced stiffness are utilized (e.g. aluminum with lower yield stress instead of harder copper). Both measures severely limit the technology and may result in adverse side effects. Hence, improved crack-stop measures are desired.

SUMMARY

According to an embodiment of a semiconductor device, the semiconductor device comprises a structured interlayer on a substrate, a structured power metallization on the structured interlayer, and a barrier on the structured power metallization and configured to prevent diffusion of at least one of dipole molecules (such as water, moisture), positive and negative ions such as water ions (e.g. hydroxide), metal ions (e.g. sodium ions, potassium ions or calcium ions), chloride ions, sulphur ions, and fluoride ions towards the structured power metallization, wherein a first defined edge of the structured interlayer faces the same direction as a first defined edge of the structured power metallization and extends beyond the first defined edge of the structured power metallization by at least 0.5 microns, wherein the structured interlayer has a compressive residual stress at room temperature and the structured power metallization generates a tensile stress at room temperature that is at least partly counteracted by the compressive residual stress of the structured interlayer, wherein the first defined edge of the structured power metallization has a sidewall which slopes inward.

In some embodiments, the barrier is configured to prevent the diffusion of not only one but all of water (e.g. moisture), water ions (e.g. hydroxide), sodium ions, potassium ions, calcium ions, chloride ions, sulphur ions, and fluoride ions. In other embodiments, the barrier is configured to prevent the diffusion of two or more of water (e.g. moisture), water ions (e.g. hydroxide), sodium ions, potassium ions, calcium ions, chloride ions, sulphur ions, and fluoride ions. In yet other embodiments, the barrier is configured to prevent the diffusion of only one of water (e.g. moisture), water ions (e.g. hydroxide), sodium ions, potassium ions, calcium ions, chloride ions, sulphur ions, and fluoride ions.

According to an embodiment of a method of manufacturing a semiconductor device, the method comprises: forming a structured interlayer on a substrate; forming a structured power metallization on the structured interlayer, wherein a first defined edge of the structured interlayer faces the same direction as a first defined edge of the structured power metallization and extends beyond the first defined edge of the structured power metallization by at least 0.5 microns, wherein the structured interlayer has a compressive residual stress at room temperature and the structured power metallization generates a tensile stress at room temperature that is at least partly counteracted by the compressive residual stress of the structured interlayer; etching the first defined edge of the structured power metallization so that the first defined edge of the structured power metallization has a sidewall which slopes inward; and forming a barrier on the structured power metallization, the barrier configured to prevent diffusion of at least one of water, water ions, sodium ions, potassium ions, chloride ions, fluoride ions, and sulphur ions towards the structured power metallization.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 8A through 8E illustrate still another embodiment of a method of manufacturing a semiconductor device having a structured, compressive interlayer with a defined crack-stop edge extension.

FIGS. 9A through 9D illustrate partial sectional views of an embodiment of a method of manufacturing a semiconductor device having a structured, compressive interlayer with a defined crack-stop edge extension and also having a barrier.

DETAILED DESCRIPTION

The embodiments described herein provide a structured, compressive interlayer having a defined crack-stop edge extension. The structured interlayer reduces crack probability without necessitating a change in temperature profile of the device manufacturing process, the properties of the overlying metallization, or the topology of the underlying substrate. This is achieved by placing a robust, high-fracture strength structured interlayer of suitable thickness and compressive residual stress at room temperature between the overlying metal and the underlying brittle layers. The structured interlayer extends by a defined amount, also referred to herein as overlap, beyond the defined edges of the overlying metal. The structured interlayer spreads the tensile stress emanating from the defined edges of the metallization, thereby reducing the peak stress in the underlying substrate. The compressive residual stress of the structured interlayer counteracts the tensile stress caused by cool-down, and thus acts against cracking (the fracture strength of brittle materials being generally much larger under compression than under tension). The structured interlayer effectively decouples the metallization edge from the substrate and the substrate topology by a fixed extension (overlap). Hence, a crack-critical topology (e.g. a substrate surface with grooves) is either covered and hence protected by the stress-distributing layer, or when not covered, is provided with a safe overlap distance from the free metal edge.

Figure 1:
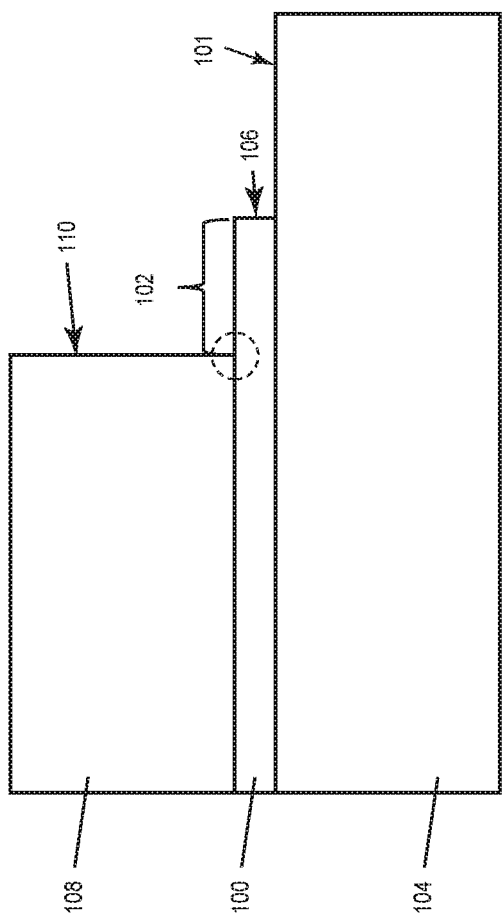
FIG. 1 illustrates a partial sectional view of an embodiment of a semiconductor device having a structured, compressive interlayer with a defined crack-stop edge extension.

FIG. 1 illustrates a partial sectional view of a semiconductor device having a structured, compressive interlayer 100 with a defined crack-stop edge extension 102.

Figure 2:
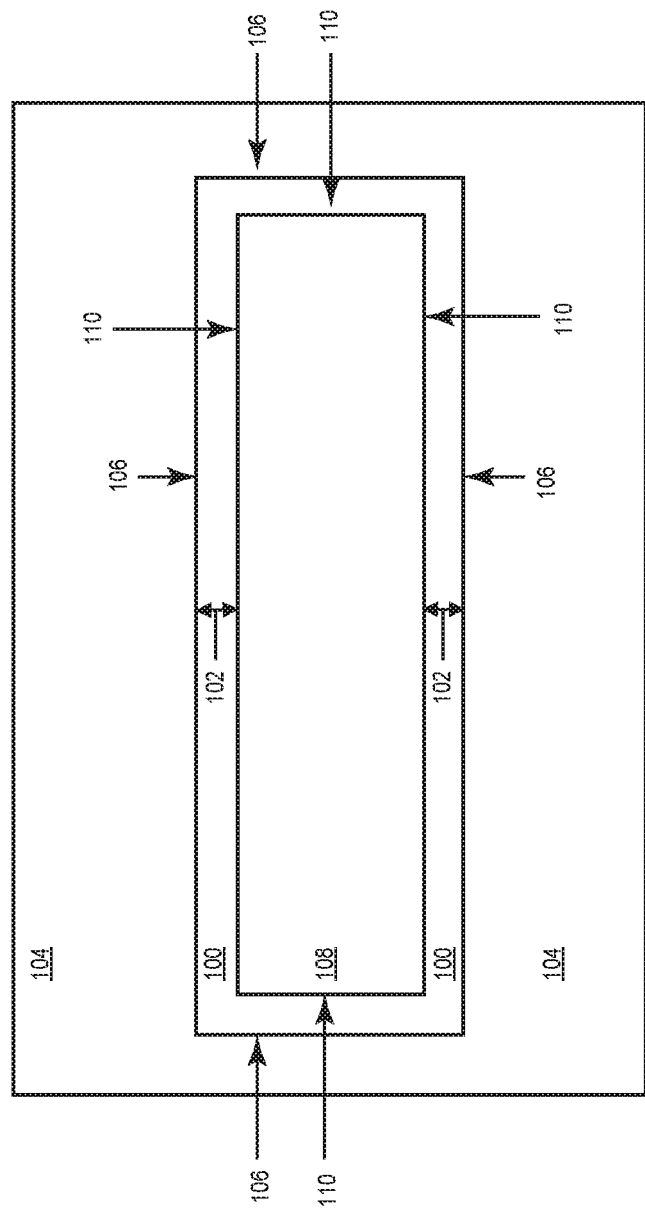
FIG. 2 shows a corresponding top-down plan view of the part of the semiconductor device shown in FIG. 1.

FIG. 2 shows a corresponding top-down plan view of the part of the semiconductor device shown in FIG. 1.

The structured interlayer 100 is formed on a substrate 104 and has defined edges 106. In one embodiment, the underlying substrate 104 is a semiconductor substrate such as Si, GaN on Si, GaN on SiC, GaN on sapphire, SiC, etc. In another embodiment, the underlying substrate 104 is an interlevel dielectric such as an $SiO_2$-based interlevel dielectric, a $Si_3N_4$-based interlevel dielectric, etc. In either case, the semiconductor device also has a structured metallization 108 on the structured interlayer 100. The metallization 108 can be structured (patterned) as desired and has defined edges 110. The structured metallization 108 together with the structured interlayer 100 can be applied over the front or back side of the substrate 104. The structured metallization 108 can comprise a single layer or multiple (more than one) layers of metal. In some cases, the structured metallization 108 is a thick (e.g. >5 μm) and stiff (high E-modulus/high yield stress) metallization such as thick Cu, Al or Au power metal for a power semiconductor device. However, the structured metallization 108 need not be a power metallization layer of a power semiconductor device but may instead be thinner, e.g., in the case of advanced CMOS designs.

Various metallization/interlayer combinations are contemplated. For example, the structured metallization 108 can comprise Cu and the structured interlayer 100 can comprise at least one of Ti, TiW, W and Ta. In another embodiment, the structured metallization 108 comprises Al or an Al alloy and the structured interlayer 100 comprises at least one of Ti, TiN and W. In yet another embodiment, the structured metallization 108 comprises Au and the structured interlayer 100 comprises any suitable barrier layer and/or adhesion promotion layer compatible with Au. A common barrier layer for at least Cu and Al metal systems is TiW, which can be compressive or tensile depending on the choice of deposition parameters. Hence, if the structured interlayer 100 comprises a single layer of TiW, the TiW layer should be deposited so as to have a compressive residual stress at room temperature. Still other metallization/interlayer combinations are possible.

In each case, the structured interlayer 100 has an overall compressive residual stress at room temperature. For example, the structured interlayer 100 can comprise a single layer having a compressive residual stress at room temperature. In another embodiment, the structured interlayer 100 can comprise a combination of tensile and compressive layers but in total has an overall compressive residual stress at room temperature. For example, at least one layer can have a compressive residual stress at room temperature and at least one other layer can have a tensile residual stress at room temperature. However, the overall residual stress of such a composite structured interlayer 100 is still compressive at room temperature despite the presence of one or more tensile layers.

Regardless of the metallization/interlayer combination and type of semiconductor device (power device, logic device, etc.), each defined edge 106 of the structured interlayer 100 neighbors one of the defined edges 110 of the structured metallization 108 and runs in the same direction as the neighboring defined edge 110 of the structured metallization 108. Each defined edge 106 of the structured interlayer 100 extends beyond the neighboring defined edge 110 of the structured metallization 108 by at least 0.5 microns, so that each defined edge 110 of the structured metallization 108 terminates before reaching the neighboring defined edge 106 of the structured interlayer 100. Hence, the structured interlayer 100 looks like a flange in the top plan view of FIG. 2 in that the structured interlayer 100 projects further outward laterally than the structured metallization 108 and each defined edge 110 of the structured metallization 108 terminates before reaching the neighboring edge 106 of the structured interlayer 100.

The amount by which each defined edge 106 of the structured interlayer 100 extends beyond the neighboring defined edge 110 of the structured metallization 108 is a function of the thickness and yield stress of the structured metallization 108. In one embodiment, each defined edge 106 of the structured interlayer 100 extends beyond the neighboring defined edge 110 of the structured metallization 108 by more than 0.5 microns and less than 15 microns. For example, each defined edge 106 of the structured interlayer 100 can extend beyond the neighboring defined edge 110 of the structured metallization 108 by at least 1 micron. In the case of a planar substrate surface 101 on which the structured interlayer 100 is formed, each defined edge 106 of the structured interlayer 100 can extend beyond the neighboring defined edge 110 of the structured metallization 108 by at least 0.5 microns and less than 5 microns, or by at least 0.5 microns and less than 10 microns, etc. In the case of a nonplanar substrate surface 101 on which the structured interlayer 100 is formed, each defined edge 106 of the structured interlayer 100 can extend beyond the neighboring defined edge 110 of the structured metallization 108 by at least 2 microns and less than 15 microns, or by at least 2 microns and less than 30 microns, etc. For example, each defined edge 106 of the structured interlayer 100 can extend beyond the neighboring defined edge 110 of the structured metallization 108 by at least 4 microns and less than 15 microns. Even larger extensions for planar and non-planar substrate surfaces are contemplated.

Figure 4:
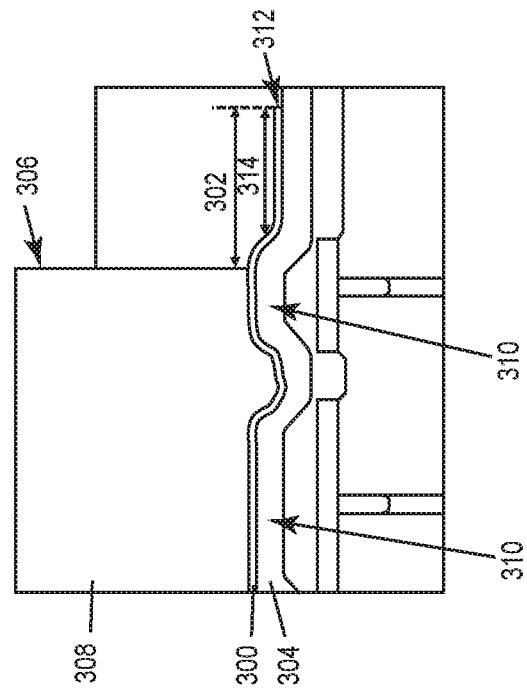
FIG. 4 illustrates a partial sectional view of yet another embodiment of a semiconductor device having a structured, compressive interlayer with a defined crack-stop edge extension.
Figure 3:
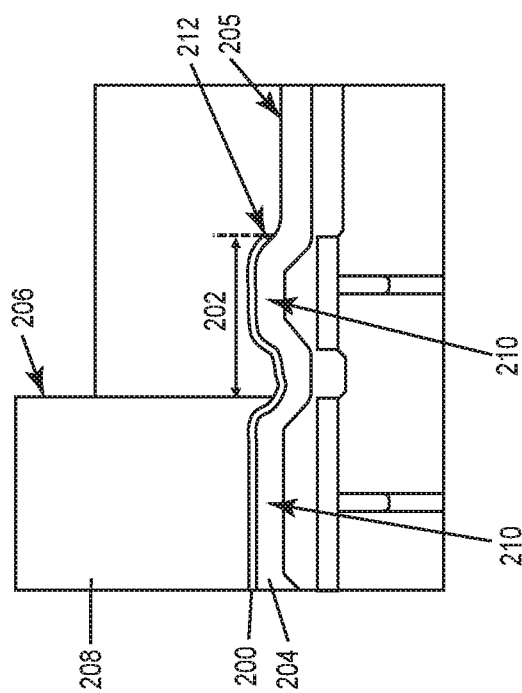
FIG. 3 illustrates a partial sectional view of another embodiment of a semiconductor device having a structured, compressive interlayer with a defined crack-stop edge extension.

The length of the defined crack-stop edge extension 102 of the structured interlayer 100 can differ depending on whether the structured interlayer 100 in combination with the structure metallization 108 are applied to the front or back side of the substrate 108. FIGS. 3 and 4 described later herein show the structured interlayer 100 in combination with the structure metallization 108 applied to the front side of the substrate 108. In the case of being applied to the back side of the substrate 104, the structured metallization 108 may comprise metal plates such as copper plates on the substrate back side. Alignment precision for such metal plates is poor, since the back-side lithography is commonly aligned to front-side structures, resulting in large tolerance e.g. in the range of 10 microns to 30 microns. Each defined edge 106 of the structured interlayer 100 can extend by a sufficiently large amount beyond the edges 110 of the structured metallization 108 on the substrate back side to mitigate cracking. For example, each defined edge 106 of the structured interlayer 100 can extend by 2 microns to 15 microns, 10 microns to 100 microns, or up to 10% of the lateral dimension of the structured metallization 108 in the direction perpendicular to the defined edges 110 of the structured metallization 108, etc. In the case of relatively large metal plates e.g. typically 500×1000 um² metal plates, the structured interlayer 100 could overlap by about 50 microns to 100 microns.

The structured metallization 108 and the structured interlayer 100 are illustrated with simple rectangular shapes for ease of illustration in the top-down plan view of FIG. 2. In general, the structured metallization 108 and the structured interlayer 100 may have any shape such as, but not limited to, square, rectangular, linear, rectilinear, curved, meandering, etc. Also in FIG. 2, the defined crack-stop edge extension 102 of the structured interlayer 100 need not be equal size along all defined edges 110 of the structured metallization 108, thus allowing for area optimization (less extension) at less critical locations and maximum crack-risk prevention (more extension) at more critical locations. For example, the defined crack-stop edge extension 102 of the structured interlayer 100 may be smaller (less overlap) along edges 110 of the structured metallization 108 less likely to cause cracking and larger (more overlap) along edges 110 of the structured metallization 108 more likely to cause cracking. The size of the defined crack-stop edge extension 102 along the defined edges 110 of the structured metallization 108 can also depend on the topology of the substrate 104. For example, the defined crack-stop edge extension 102 of the structured interlayer 100 may be smaller (less overlap) over planar portions of the substrate surface and larger (more overlap) over non-planar portions of the surface.

Because of the compressive nature of the structured interlayer 100 and the 0.5 micron or greater lateral extension 102 beyond the defined edges 110 of the structured metallization 108, the interlayer 100 reduces crack probability in the underlying substrate 104. During cooling of the structured metallization 108, the metallization 108 becomes tensile and pulls back, imparting stress. The greatest degree of stress occurs along the edge interface with the structured interlayer 100 which is indicated by the dashed curved line in FIG. 1. However, the defined crack-stop edge extension 102 of the structured interlayer 100 combined with the compressive nature of the interlayer 100 at room temperature yields a counter stress. As a result, tensile stresses underneath the metallization-interlayer terminating edge are significantly reduced. Significant stress reduction is realized for both planar and non-planar substrate surfaces.

FIG. 3 illustrates a partial sectional view of another semiconductor device having a structured, compressive interlayer 200 with a defined crack-stop edge extension 202. According to this embodiment, the substrate 204 has a non-planar surface 205 on which the structured interlayer 200 is formed and some of the defined edges 206 of the structured metallization 208 terminate between raised features 210 of the non-planar surface 205. Each defined edge 212 of the structured interlayer 200 neighboring a defined edge 206 of the structured metallization 208 that terminates between raised features 210 of the non-planar surface 205 extends beyond that neighboring defined edge 206 of the structured metallization 208 by at least 3 microns, e.g. by at least 4 microns.

FIG. 4 illustrates a partial sectional view of yet another semiconductor device having a structured, compressive interlayer 300 with a defined crack-stop edge extension 302. According to this embodiment, the substrate 304 has a non-planar surface on which the structured interlayer 300 is formed and some of the defined edges 306 of the structured metallization 308 terminate over raised features 310 of the non-planar surface instead of between the raised features 310. Each defined edge 312 of the structured interlayer 300 neighboring a defined edge 306 of the structured metallization 308 that terminates over a raised feature 310 of the non-planar surface extends beyond that neighboring defined edge 306 of the structured metallization 308 by at least 3 microns, e.g. by at least 4 microns. In some cases, each defined edge 312 of the structured interlayer 300 neighboring a defined edge 306 of the structured metallization 308 that terminates over a raised feature 310 of the non-planar surface extends beyond that raised feature 310 of the non-planar surface as indicated by reference number 314 in FIG. 4.

Figure 5A:
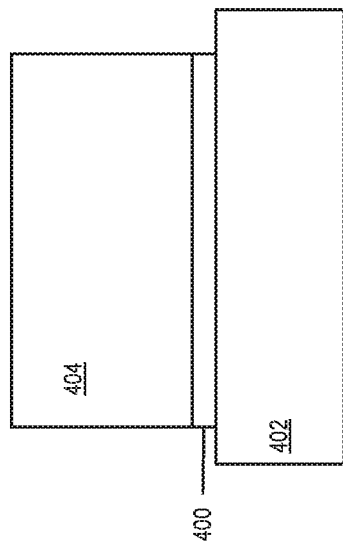
FIGS. 5A through 5D illustrate an embodiment of a method of manufacturing a semiconductor device having a structured, compressive interlayer with a defined crack-stop edge extension.
Figure 5B:
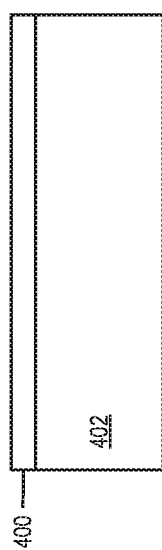
Figure 5C:
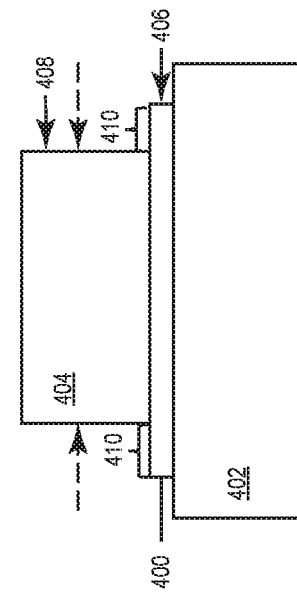
Figure 5D:
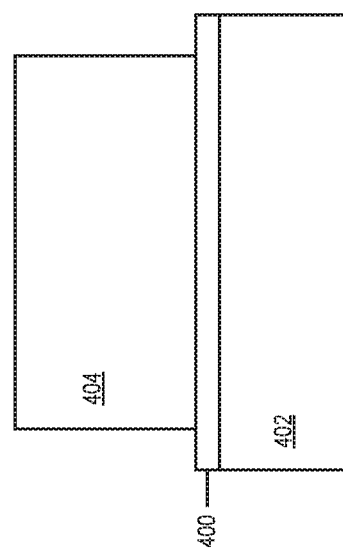

FIGS. 5A through 5D illustrate an embodiment of a method of manufacturing a semiconductor device having a structured, compressive interlayer with a defined crack-stop edge extension. According to this embodiment, the compressive interlayer is structured by selective metal etch after metal deposition and patterning. In FIG. 5A, an interlayer material system 400 is deposited on a substrate 402. The interlayer material system 400 comprises one or more material layers and has an overall compressive residual stress at room temperature. In FIG. 5B, metal 404 such as Cu, Al, Au, etc. is deposited and patterned (e.g. by standard lithography) on the interlayer material system 400. In FIG. 5C, the deposited and structured metal 404 is used as a mask to remove the part of the interlayer material system 400 unprotected by the deposited and structured metal 404. Any standard selective etching process can be used to remove the exposed parts of the interlayer material system 400. In FIG. 5D, the deposited and structured metal 404 is etched laterally selective to the interlayer material system 400 as indicated by the inward-facing dashed lines, so that each defined edge 406 of the interlayer material system 400 extends beyond the neighboring defined edge 408 of the deposited and structured metal 404 by at least 0.5 microns. Here, the degree of lateral etch-back of the deposited and structured metal 404 determines the length of crack-stop edge extension 410 as shown in FIG. 5D. Any standard selective metallization etching process can be used to form the crack-stop edge extension 410 of the structured interlayer 402.

Figure 6D:
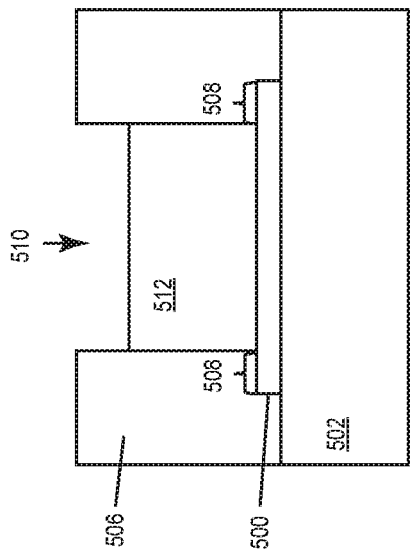
FIGS. 6A through 6E illustrate another embodiment of a method of manufacturing a semiconductor device having a structured, compressive interlayer with a defined crack-stop edge extension.
Figure 6E:
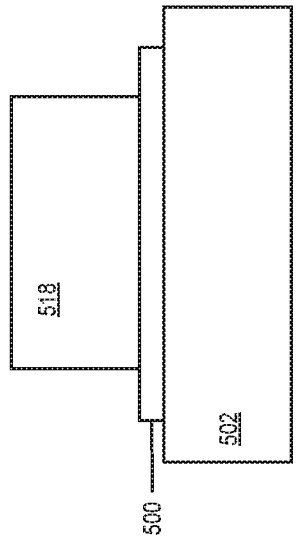
Figure 6A:
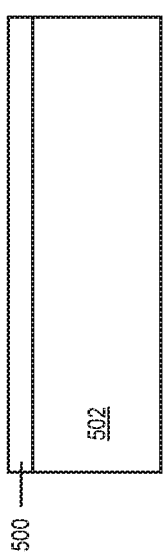
Figure 6B:
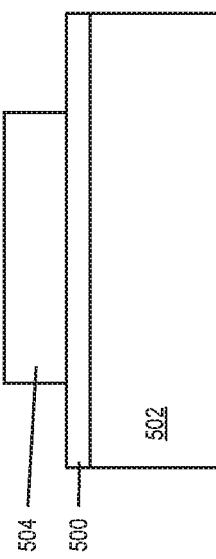
Figure 6C:
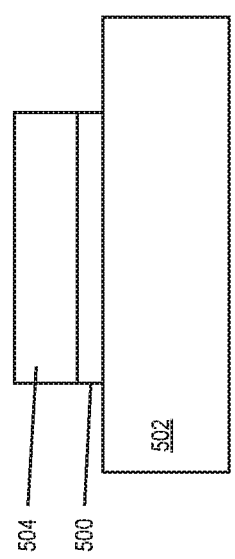

FIGS. 6A through 6E illustrate another embodiment of a method of manufacturing a semiconductor device having a structured, compressive interlayer with a defined crack-stop edge extension. According to this embodiment, the compressive interlayer is structured by dedicated interlayer-lithography before metal deposition. In FIG. 6A, an interlayer material system 500 is deposited on a substrate 502. The interlayer material system 500 comprises one or more material layers and has an overall compressive residual stress at room temperature. In FIG. 6B, a mask 504 such as a photoresist mask is formed on the interlayer material system 500. In FIG. 6C, the exposed part of the interlayer material system 500 is etched selective to the mask 504 to form the structured interlayer before depositing any metal of the structured metallization. The mask 504 is then removed. In FIG. 6D, a second mask 506 such as a photoresist mask is formed on the structured interlayer 500. The second mask 506 covers at least a 0.5 micron periphery 508 around the perimeter of the structured interlayer 500 and has an opening 510 which exposes the structured interlayer 500 inward from the periphery 508. Here, the amount of mask coverage on the periphery 508 of the structured interlayer 500 determines the length of crack-stop edge extension as shown in FIG. 6D. Metal 512 is then deposited in the opening 510 of the second mask 506 to form the structured metallization 518. The mask 506 prevents the metal 512 from being deposited on the periphery 508 of the structured interlayer 500. FIG. 6E shows the resulting device after structure metallization formation.

Figure 7E:
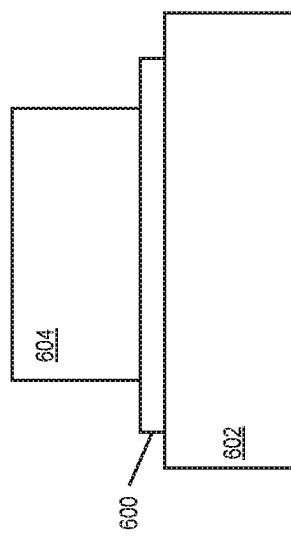
FIGS. 7A through 7E illustrate yet another embodiment of a method of manufacturing a semiconductor device having a structured, compressive interlayer with a defined crack-stop edge extension.
Figure 7C:
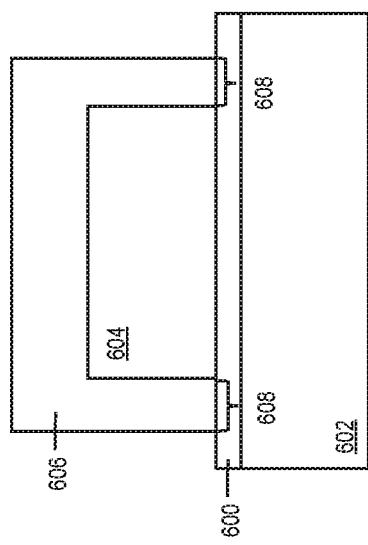
Figure 7D:
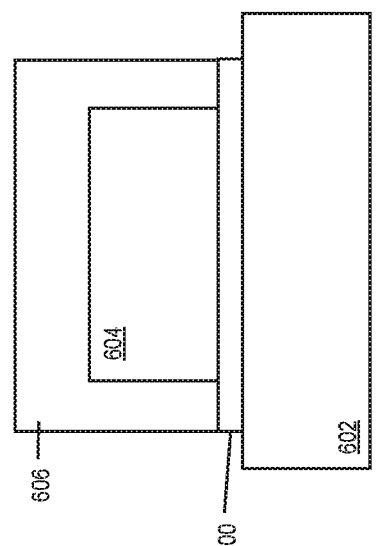
Figure 7A:
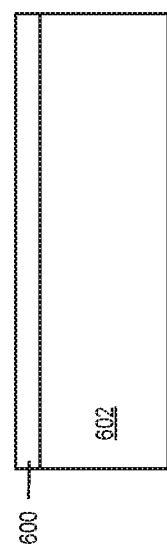
Figure 7B:
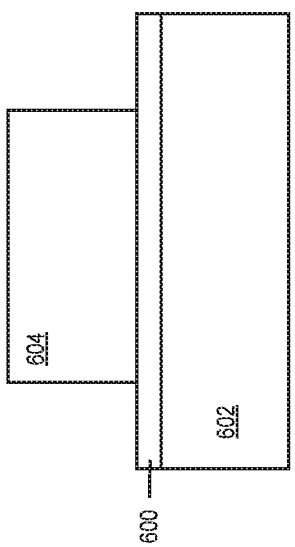

FIGS. 7A through 7E illustrate yet another embodiment of a method of manufacturing a semiconductor device having a structured, compressive interlayer with a defined crack-stop edge extension. According to this embodiment, the compressive interlayer is structured by dedicated interlayer-lithography after metal deposition. In FIG. 7A, an interlayer material system 600 is deposited on a substrate 602. The interlayer material system 600 comprises one or more material layers and has an overall compressive residual stress at room temperature. In FIG. 7B, a structured metallization 604 is formed on the interlayer material system 600 e.g. by standard deposition and lithographic patterning of metal. In FIG. 7C, the structured metallization 604 is covered with a mask 606 such as a photoresist mask. This interlayer-lithography is aligned to the structured metallization 604. The mask 606 is wider than the structured metallization 604, so that the mask 606 extends onto the interlayer material system 600 by at least 0.5 microns beyond the perimeter of the structured metallization 604 as indicated by reference number 608 in FIG. 7C. In FIG. 7D, the part of the interlayer material system 600 unprotected by the mask 606 is removed e.g. by standard selective etching. FIG. 7E shows the device after interlayer material system etching. Here, the length of defined crack-stop edge extension is a function of the amount 608 by which the mask 606 extends onto the interlayer material system 600 as shown in FIGS. 7C and 7D.

FIGS. 8A through 8E illustrate still another embodiment of a method of manufacturing a semiconductor device having a structured, compressive interlayer with a defined crack-stop edge extension. According to this embodiment, the compressive interlayer comprises two layers of different materials. In FIG. 8A, a first interlayer material 700 such as a barrier layer is deposited on a substrate 702 and a second interlayer material 704 such as a seed layer is formed on the first interlayer material 700 to yield a bilayer interlayer 706 having an overall compressive residual stress at room temperature. In FIG. 8B, a mask 708 such as a photoresist mask is formed on the compressive bilayer interlayer 706. In FIG. 8C, the exposed part of the second interlayer material 704 is etched selective to the mask 708 and the first interlayer material 700 before depositing any metal of the structured metallization. The mask 708 is then removed. In FIG. 8D, a second mask 710 such as a photoresist mask is formed on the etched second interlayer material 704. The second mask 710 covers at least a 0.5 micron periphery 712 around the perimeter of the etched second interlayer material 704 and has an opening 714 which exposes the etched second interlayer material 704 inward from the periphery 712. Here, the amount of mask coverage on the periphery 712 of the etched second interlayer material 704 determines the length of crack-stop edge extension. Metal 716 is then deposited in the opening 714 of the second mask 710 to form the structured metallization. The mask 710 prevents the metal 716 from being deposited on the periphery 712 of the etched second interlayer material 704. In FIG. 8E, the second mask 710 is removed and the first (bottom) interlayer material 700 is etched selective to the second (upper) interlayer material 704 and to the metal 716 to form the structured interlayer 100.

To enhance robustness of the structured metallization 108 against ion contamination which may lead to electromigration and/or other failure mechanism under various conditions, e.g., such as high electric fields between different segments of the structured metallization 108 in the case of a power metallization with narrow lateral spacings, e.g., down to 5 µm (microns) or less, a barrier may be provided on the structured power metallization 108. For example, Cu power metallization may be covered with polyimide or PBO (polybenzoxazoles) and degradation may occur at the package interface with a molding compound. Ions can attack the polyimide or PBO, which are poor barriers to begin with, and provoke Cu migration in the presence of an electric field. The barrier mentioned above is configured i.e. arranged or prepared to prevent at least one of dipole molecules (such as water, moisture), positive and negative ions such as water ions (e.g. hydroxide), metal ions (e.g., sodium ions, potassium ions or calcium ions), chloride ions, sulphur ions, and fluoride ions (hereinafter ions) from diffusing towards the structured metallization 108. In some embodiments, the barrier is configured to prevent the diffusion of not only one but all of water (e.g. moisture), water ions (e.g. hydroxide), sodium ions, potassium ions, calcium ions, chloride ions, sulphur ions, and fluoride ions. In other embodiments, the barrier is configured to prevent the diffusion of two or more of water (e.g. moisture), water ions (e.g. hydroxide), sodium ions, potassium ions, calcium ions, chloride ions, sulphur ions, and fluoride ions. In yet other embodiments, the barrier is configured to prevent the diffusion of only one of water (e.g. moisture), water ions (e.g. hydroxide), sodium ions, potassium ions, calcium ions, chloride ions, sulphur ions, and fluoride ions. Hence the use of the term 'barrier' herein. Such a barrier may be realized based on appropriate selection of various properties such as barrier thickness, barrier composition, etc.

Preventing at least one of dipole molecules (such as water, moisture), positive and negative ions such as water ions (e.g.

hydroxide), metal ions (e.g. sodium ions, potassium ions or calcium ions), chloride ions, sulphur ions, and fluoride ions (hereinafter ions) from diffusing towards the structured metallization 108 achieves in embodiments that the barrier blocks enough ions from reaching the structured metallization 108 over a specified lifetime of the device. The device lifetime may be specified, e.g., as a number of power-on hours within a specified voltage operating range. Hence, the barrier may be viewed as a reliability enhancement mechanism that blocks enough ions from reaching the structured metallization 108 over the specified lifetime of the device so that the structured metallization 108 does not fail during the specified lifetime, e.g., due to electromigration or other reliability mechanisms which may otherwise shorten the device lifetime.

In addition to the barrier, one, some or all of the defined edges 110 of the structured metallization 108 are etched so as to have an inwardly sloping sidewall. The inwardly sloping sidewall in combination with the barrier prevents various electrical failure mechanisms. Described next are additional embodiments in which a barrier is provided on the structured metallization 108 and configured to prevent ions from diffusing towards the structured metallization 108, and at least one of the defined edges 110 of the structured metallization 108 is etched so as to have an inwardly sloping sidewall.

Figure 9A:
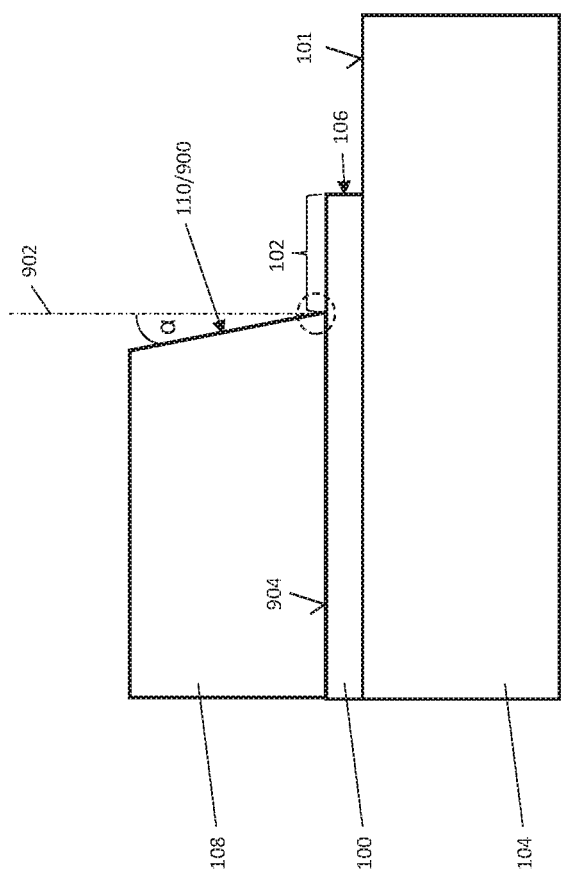
Figure 9C:
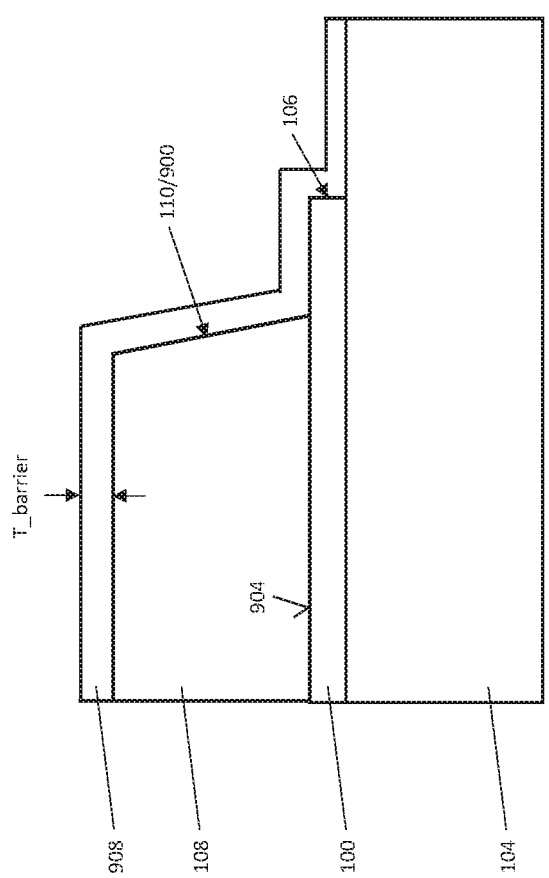
Figure 9D:
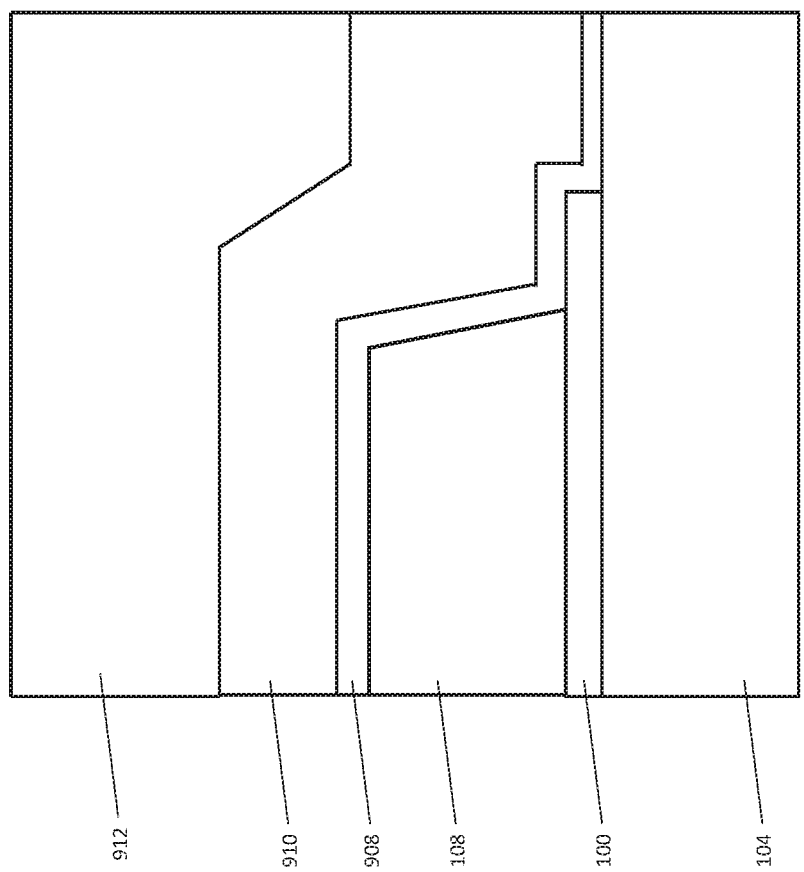

FIG. 9A illustrates a partial sectional view of a power semiconductor device having the structured, compressive interlayer 100 with defined crack-stop edge extension 102 and the structured metallization 108 on the structured interlayer 100 previously described herein, but prior to barrier formation. FIG. 9B shows at least one defined edge 110 of the structured power metallization 108 with and without an inwardly sloping sidewall 900. FIG. 9C shows the same power semiconductor device, but after barrier formation. FIG. 9D shows the power semiconductor device after molding.

According to the embodiment illustrated in FIGS. 9A through 9D, the structured metallization 108 is a power metallization in that the structured metallization 108 carries all or substantially all of the device (load) current during operation. Hence, the structured metallization 108 is a relatively thick (e.g. 1 μm to 30 μm thick) and stiff (high E-modulus/high yield stress) metallization such as thick Cu, Al or Au power metal.

At least one of the defined edges 110 of the structured power metallization 108 is etched so as to have an inwardly sloping sidewall 900, as shown in the left hand part of FIG. 9B which shows an enlarged view of the bottom corner region of the defined edge 110 with the sloped sidewall 900 where the defined edge 110 meets the structured interlayer 100. The sloped sidewall 900 allows for improved conformal deposition of a thick barrier. In one embodiment, the sidewall 900 slopes inward at an angle α greater than 0 degrees and up to 10 degrees relative to a normal line 902 which is perpendicular to the surface 904 of the structured interlayer 100 on which the structured power metallization 108 is disposed. In some embodiments, the inwardly sloping sidewall 900 may terminate at the surface 904 of the structured interlayer 100.

In the specific case of Cu as the structured power metallization 108, the inwardly sloping sidewall 900 may be formed by wet chemical etching at least one of the defined edges 110 of the structured power metallization 108 with a mixture of acid and hydrogen peroxide for a duration of greater than 20 seconds (also referred to herein as over-etching). Such an over-etching yields a sidewall 900 which slopes inward at an angle α greater than 0 degrees and up to 10 degrees relative to the normal line 902.

Although a large variation in the sidewall angle α may be present across the structured power metallization 108 of the same die and from die-to-die, the average (mean) sidewall angle α of each sloped sidewall 900 may be made greater than 0 degrees and up to, e.g., 10 degrees relative to the normal line 902 by wet chemical etching each unprotected defined edge 110 of the structured power metallization 108 for more than 20 seconds and up to 90 seconds. Wet chemical etching each unprotected defined edge 110 of the structured power metallization 108 without over-etching yields an average (mean) sidewall angle α of 0 degrees relative to the normal line 902, as shown in the right hand part of FIG. 9B which shows an enlarged view of the bottom corner region of a defined edge 110 without over-etching.

Over-etching each unprotected defined edge 110 of the structured power metallization 108 also helps to reduce the lateral dimension L_lat1 of an undercut side face 906 of the sloped sidewall 900 of the structured power metallization 108 and which meets the structured interlayer 100. The left hand part of FIG. 9B shows a smaller lateral dimension L_lat1 for the undercut side face 906 of the sloped sidewall 900 as compared to a lateral dimension L_lat2 of the undercut side face 906 of the sidewall 110 without over-etching in the right hand part of FIG. 9B (i.e. L_lat1<L_lat2 in FIG. 9B).

Reducing the lateral dimension L_lat1 of the undercut side face 906 ensures better adhesion between the barrier 908, which is shown in FIG. 9C, and the structured interlayer 100 in the lower corner region of the sloped sidewall 900 of the structured power metallization 108. The lower corner region of the sloped sidewall 900 is indicated by the smaller dashed circle in FIG. 9A.

In one embodiment, the lateral dimension L_lat1 of the undercut side face 906 of the sloped sidewall 900 in the corner region is reduced to less than half the thickness of the subsequently formed barrier 908 by extending the duration of the over-etching. In the case of Cu as the structured power metallization 108, the amount of reduction (L_lat2−L_lat1) of the lateral dimension L_lat1 of the undercut side face 906 of the sloped sidewall 900 in the corner region also depends on the Cu grain structure of the structured power metallization 108.

The etching of the structured power metallization 108 not only better optimizes the angle α of the sloped sidewall 900 for subsequent conformal thick barrier deposition but also exposes the underlying structured interlayer 100, e.g., TiW layer, allowing for deposition of a thick, conformal barrier 908 on the structured power metallization 108 and on the exposed structured interlayer 100, as shown in FIG. 9C. Properties such as thickness, composition, etc., of the barrier 908 are selected so that the barrier 908 is configured to prevent diffusion of at least one of dipole molecules (such as water, moisture, etc.), positive and negative ions such as water ions (e.g. hydroxide), metal ions (e.g. sodium ions, potassium ions, calcium ions, etc.), chloride ions, sulphur ions, and fluoride ions towards the structured power metallization 108. As explained above, sloping the sidewall 900 of at least one of the defined edges 110 of the structured metallization 108 ensures good adhesion between the thick, conformal barrier 108 and the structured power metallization 108, especially along each sloped sidewall 900 and in the lower corner region of each sloped sidewall 900.

Figure 10:
FIGS. 10 through 12 illustrate respective partial sectional views of different embodiments of the barrier.
Figure 11:
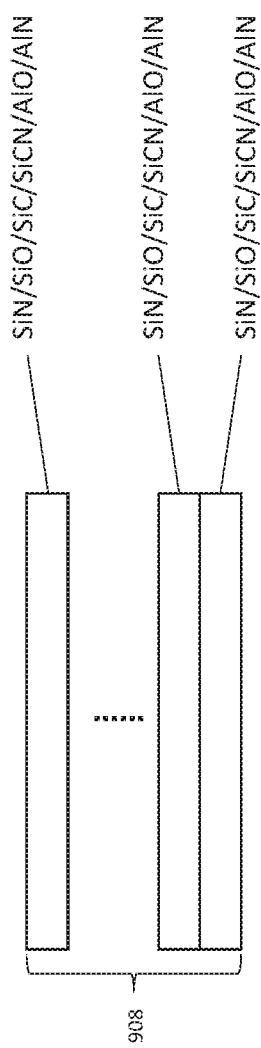

In one embodiment, the thick barrier 908 is formed by depositing one or more of SiN (silicon nitride), SiO (silicon oxide), SiC (silicon carbide), SiCN (silicon carbide nitride), AlO (aluminium oxide) and AlN (aluminium nitride) on the structured power metallization 108 and on the exposed structured interlayer 100. For example, the thick barrier 908 may be a single layer comprising one of SiN, SiO, SiC, SiCN, AlO or AlN as partly shown in FIG. 10, or may comprise a stack of layers including SiN, SiO, SiC, SiCN, AlO and/or AlN as partly shown in FIG. 11.

The thickness (T_barrier) of the barrier 900 is in some embodiments at least 100 nm, in some embodiments at least 200 nm, in some embodiments at least 400 nm and in some embodiments at least 600 nm. For example, the barrier 908 may comprise any electrically isolating material(s) with no or minimum seam line and may have a thickness T_barrier in a range from about 100 nm to 1 or more microns. The barrier 908 adheres sufficiently to the structured power metallization 108 and to the exposed structured interlayer 100 and enables good adhesion to any materials subsequently formed above the barrier 908 such as an imide 910 and/or PBO 910 and/or molding compound 912, e.g., as shown in FIG. 9D.

Figure 12:
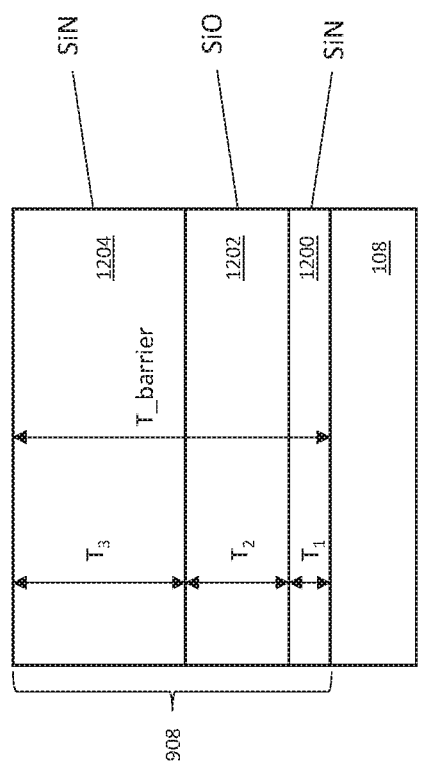

FIG. 12 illustrates a partial sectional view of the barrier 908 according to another embodiment. In FIG. 12, the barrier 908 comprises a first SiN layer 1200 arranged closest to the structured power metallization 108, a SiO layer 1202 on the first SiN layer 1200, and a second SiN layer 1204 on the SiO layer 1202, the second SiN layer 1204 being thicker than the first SiN layer 1200. The SiO layer 1202 may be thicker than the first SiN layer 1200 and thinner than the second SiN layer 1204, i.e., $T_1 \leq T_2 \leq T_3$. In one embodiment, the SiO layer 1202 is at least two times as thick as the first SiN layer 1200, i.e., $T_2 \geq 2 \times T_1$, and the second SiN layer 1204 is at least three times as thick as the first SiN layer 1200, i.e., $T_3 \geq 3 \times T_1$. For example, the first SiN layer 1200 may have a thickness T1 of about 100 nm+/−10%, the SiO layer 1202 may have a thickness T2 of about 200 nm+/−10%, and the second SiN layer 1204 may have a thickness T3 of about 300 nm+/−10%. The barrier 908 preferably has a generally uniform thickness T_barrier and conforms to the surface topography of the structured power metallization 108, where T_barrier=T1+T2+T3 in FIG. 12. However, other combinations of the thicknesses $T_1$, $T_2$, $T_3$ may be provided in other embodiments. For example $T_2 \leq T_3 \leq T_1$ or $T_1 \leq T_3 \leq T_2$ or $T_2 \leq T_1 \leq T_3$ or $T_3 \leq T_2 \leq T_1$ or $T_3 \leq T_1 \leq T_2$.

FIG. 9D shows the power semiconductor device after molding. In one embodiment, an imide 910 such as polyimide is formed on the barrier 908 and a molding compound 912 is formed on the imide 910. In other embodiments, polybenzoxazoles (PBO) or other polymers may be formed instead of or in addition to imide 910. Any typical molding process such as injection molding, compression molding, film-assisted molding (FAM), reaction injection molding (RIM), resin transfer molding (RTM), map molding, blow molding, etc. may be used to embed the power semiconductor device in the molding compound 912. Common mold compounds and resins include, but are not limited to, thermoset resins, gel elastomers, encapsulants, potting compounds, composites, optical grade materials, etc. In some embodiments, the imide 910 may be omitted and the molding compound 912 formed directly on the barrier 908.

Although the present disclosure is not so limited, the following numbered examples demonstrate one or more aspects of the disclosure.

Example 1. A semiconductor device, comprising: a structured interlayer on a substrate; a structured power metallization on the structured interlayer: and a barrier on the structured power metallization and configured to prevent diffusion of at least one of water, water ions, sodium ions, potassium ions, chloride ions, fluoride ions, and sulphur ions towards the structured power metallization, wherein a first defined edge of the structured interlayer faces the same direction as a first defined edge of the structured power metallization and extends beyond the first defined edge of the structured power metallization by at least 0.5 microns, wherein the structured interlayer has a compressive residual stress at room temperature and the structured power metallization generates a tensile stress at room temperature that is at least partly counteracted by the compressive residual stress of the structured interlayer, wherein the first defined edge of the structured power metallization has a sidewall which slopes inward.

Example 2. The semiconductor device of example 1, wherein the sidewall of the first defined edge of the structured power metallization slopes inward at an angle greater than 0 degrees and up to 10 degrees relative to a normal line which is perpendicular to a surface of the structured interlayer on which the structured power metallization is disposed.

Example 3. The semiconductor device of example 1 or 2, wherein the barrier comprises one or more of SiN, SiO, SiC, SiCN, AlO, and AlN.

Example 4. The semiconductor device of example 1 or 2, wherein the barrier is a single layer comprising one of SiN, SiO, SiC, SiCN, AlO, or AlN.

Example 5. The semiconductor device of example 1 or 2, wherein the barrier comprises a stack of layers.

Example 6. The semiconductor device of example 1 or 2, wherein the barrier comprises a first SiN layer arranged closest to the structured power metallization, a SiO layer on the first SiN layer, and a second SiN layer on the SiO layer, and wherein the second SiN layer is thicker than the first SiN layer.

Example 7. The semiconductor device of example 6, wherein the SiO layer is thicker than the first SiN layer and thinner than the second SiN layer.

Example 8. The semiconductor device of example 6, wherein the SiO layer is at least two times as thick as the first SiN layer, and wherein the second SiN layer is at least three times as thick as the first SiN layer.

Example 9. The semiconductor device of any of examples 1 through 8, wherein the barrier has a generally uniform thickness and conforms to a surface topography of the structured power metallization.

Example 10. The semiconductor device of any of examples 1 through 9, wherein the sidewall of the first defined edge of the structured power metallization has an outward projecting ledge adjacent to the structured interlayer, and wherein the outward projecting ledge has a lateral dimension which is less than half the thickness of the barrier.

Example 11. The semiconductor device of any of examples 1 through 10, further comprising: an imide on the barrier; and a molding compound on the imide.

Example 12. The semiconductor device of any of examples 1 through 11, wherein the substrate is an interlevel dielectric.

Example 13. The semiconductor device of any of examples 1 through 11, wherein the substrate is a semiconductor substrate.

Example 14. The semiconductor device of any of examples 1 through 11, wherein the semiconductor substrate comprises one of Si, GaN on Si, GaN on SiC, GaN on sapphire, and SiC.

Example 15. The semiconductor device of any of examples 1 through 14, wherein the first defined edge of the structured interlayer extends beyond the first defined edge of the structured power metallization by at least 1 micron.

Example 16. The semiconductor device of any of examples 1 through 15, wherein the structured interlayer and the structured power metallization are applied over a front side of the substrate, and wherein the first defined edge of the structured interlayer extends beyond the first defined edge of the structured power metallization by more than 0.5 microns and less than 30 microns.

Example 17. The semiconductor device of any of examples 1 through 16, wherein the substrate has a non-planar surface on which the structured interlayer is formed, and wherein the first defined edge of the structured interlayer extends beyond the first defined edge of the structured power metallization by at least 2 microns and less than 30 microns.

Example 18. The semiconductor device of example 17, wherein the first defined edge of the structured interlayer extends beyond the first defined edge of the structured power metallization by at least 4 microns and less than 15 microns.

Example 19. The semiconductor device of any of examples 1 through 16, wherein the substrate has a non-planar surface on which the structured interlayer is formed, wherein the first defined edge of the structured power metallization terminates between raised features of the non-planar surface, and wherein the first defined edge of the structured interlayer extends beyond the first defined edge of the structured power metallization by at least 3 microns.

Example 20. The semiconductor device of example 19, wherein the first defined edge of the structured interlayer extends beyond the first defined edge of the structured power metallization by at least 4 microns.

Example 21. The semiconductor device of any of examples 1 through 16, wherein the substrate has a non-planar surface on which the structured interlayer is formed, wherein the first defined edge of the structured power metallization terminates over raised features of the non-planar surface, and wherein the first defined edge of the structured interlayer extends beyond the first defined edge of the structured power metallization by at least 3 microns.

Example 22. The semiconductor device of example 21, wherein the first defined edge of the structured interlayer extends beyond the first defined edge of the structured power metallization by at least 4 microns.

Example 23. The semiconductor device of any of examples 1 through 16, wherein the substrate has a non-planar surface on which the structured interlayer is formed, wherein the first defined edge of the structured power metallization terminates over a raised feature of the non-planar surface, and wherein the first defined edge of the structured interlayer extends beyond the raised feature of the non-planar surface.

Example 24. The semiconductor device of any of examples 1 through 16, wherein the substrate has a planar surface on which the structured interlayer is formed, and wherein the first defined edge of the structured interlayer extends beyond the first defined edge of the structured power metallization by at least 0.5 microns and less than 10 microns.

Example 25. The semiconductor device of any of examples 1 through 24, wherein the structured power metallization comprises multiple layers of metal.

Example 26. The semiconductor device of any of examples 1 through 25, wherein the structured power metallization is disposed directly on the structured interlayer.

Example 27. The semiconductor device of any of examples 1 through 26, wherein the structured power metallization comprises Cu, and wherein the structured interlayer comprises at least one of TiW and W.

Example 28. The semiconductor device of any of examples 1 through 26, wherein the structured power metallization comprises Al, and wherein the structured interlayer comprises at least one of TiN and W.

Example 29. The semiconductor device of any of examples 1 through 26, wherein the structured power metallization comprises Au.

Example 30. The semiconductor device of any of examples 1 through 29, wherein the structured interlayer comprises a plurality of layers, wherein at least one of the layers has a compressive residual stress at room temperature, wherein at least one of the layers has a tensile residual stress at room temperature, and wherein the structured interlayer has an overall compressive residual stress at room temperature.

Example 31. The semiconductor device of any of examples 1 through 15 and 17 through 30, wherein the structured interlayer and the structured power metallization are applied over a back side of the substrate, and wherein the first defined edge of the structured interlayer extends beyond the first defined edge of the structured power metallization by between 2 microns and 100 microns, or up to 10% of a lateral dimension of the structured power metallization in a direction perpendicular to the defined edges of the structured power metallization.

Example 32. A method of manufacturing a semiconductor device, the method comprising: forming a structured interlayer on a substrate; forming a structured power metallization on the structured interlayer, wherein a first defined edge of the structured interlayer faces the same direction as a first defined edge of the structured power metallization and extends beyond the first defined edge of the structured power metallization by at least 0.5 microns, wherein the structured interlayer has a compressive residual stress at room temperature and the structured power metallization generates a tensile stress at room temperature that is at least partly counteracted by the compressive residual stress of the structured interlayer; etching the first defined edge of the structured power metallization so that the first defined edge of the structured power metallization has a sidewall which slopes inward; and forming a barrier on the structured power metallization, the barrier configured to prevent diffusion of at least one of water, water ions, sodium ions, potassium ions, chloride ions, fluoride ions, and sulphur ions towards the structured power metallization.

Example 33. The method of example 32, wherein etching the first defined edge of the structured power metallization comprises: wet chemical etching the first defined edge of the structured power metallization for a duration greater than 20 seconds and so that the sidewall slopes inward at an angle greater than 0 degrees and up to 10 degrees relative to a normal line which is perpendicular to a surface of the structured interlayer on which the structured power metallization is disposed.

Example 34. The method of example 33, wherein the first defined edge of the structured power metallization is wet chemical etched for up to 90 seconds.

Example 35. The method of any of examples 32 through 34, wherein forming the barrier on the structured power metallization comprises: depositing one or more of SiN, SiO, SiC, SiCN, AlO, and AlN on the structured power metallization.

Example 36. The method of any of examples 32 through 34, wherein forming the barrier on the structured power metallization comprises: forming a first SiN layer arranged closest to the structured power metallization; forming a SiO layer on the first SiN layer; and forming a second SiN layer on the SiO layer, wherein the second SiN layer is thicker than the first SiN layer.

Example 37. The method of example 36, wherein the SiO layer is thicker than the first SiN layer and thinner than the second SiN layer.

Example 38. The method of example 36, wherein the SiO layer is at least two times as thick as the first SiN layer, and wherein the second SiN layer is at least three times as thick as the first SiN layer.

Example 39. The method of any of examples 32 through 38, wherein the barrier has a generally uniform thickness and conforms to a surface topography of the structured power metallization.

Example 40. The method of any of examples 32 through 39, further comprising: forming an imide on the barrier; and molding the semiconductor device with a molding compound which covers the imide.

Example 41. The method of any of examples 32 through 40, wherein forming the structured interlayer and forming the structured power metallization comprises: depositing an interlayer material system on the substrate, the interlayer material system having an overall compressive residual stress at room temperature; depositing and patterning metal on the interlayer material system; using the deposited and structured metal as a mask to remove the part of the interlayer material system unprotected by the deposited and structured metal; and laterally etching the deposited and structured metal selective to the interlayer material system so that the first defined edge of the interlayer material system extends beyond the first defined edge of the deposited and structured metal by at least 0.5 microns.

Example 42. The method of any of examples 32 through 40, wherein forming the structured interlayer comprises: depositing an interlayer material system on the substrate, the interlayer material system having an overall compressive residual stress at room temperature; and patterning the interlayer material system to form the structured interlayer before depositing any metal of the structured power metallization.

Example 43. The method of example 42, wherein forming the structured power metallization comprises: forming a mask on the structured interlayer, the mask covering at least a 0.5 micron periphery around the perimeter of the structured interlayer and having an opening which exposes the structured interlayer inward from the periphery; and depositing metal in the opening of the mask to form the structured power metallization, wherein the mask prevents the metal from being deposited on the periphery of the structured interlayer.

Example 44. The method of any of examples 32 through 40, wherein forming the structured interlayer and forming the structured power metallization comprises: depositing a first interlayer material on the substrate and a second interlayer material on the first interlayer material, the first and the second interlayer materials forming a bilayer interlayer having an overall compressive residual stress at room temperature; etching an exposed part of the second interlayer material selective to the first interlayer material before depositing any metal of the structured power metallization; forming a mask on the etched second interlayer material, the mask covering at least a 0.5 micron periphery around the perimeter of the etched second interlayer material and having an opening which exposes the etched second interlayer material inward from the periphery; depositing metal in the opening of the mask to form the structured power metallization, wherein the mask prevents the metal from being deposited on the periphery of the etched second interlayer material; and etching an exposed part of the first interlayer material selective to the second interlayer material after depositing the metal, to form the structured interlayer.

Example 45. The method of any of examples 32 through 40, wherein forming the structured interlayer comprises: depositing an interlayer material system on the substrate, the interlayer material system having an overall compressive residual stress at room temperature; forming the structured power metallization on the interlayer material system; covering the structured power metallization with a mask, the mask being wider than the structured power metallization so that the mask extends onto the interlayer material system by at least 0.5 microns beyond the perimeter of the structured power metallization; and removing the part of the interlayer material system unprotected by the mask.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a structured interlayer on a substrate;
a structured power metallization on the structured interlayer; and
a barrier on the structured power metallization and configured to prevent diffusion of at least one of water, water ions, sodium ions, potassium ions, chloride ions, fluoride ions, and sulphur ions towards the structured power metallization,
wherein a first defined edge of the structured interlayer faces the same direction as a first defined edge of the structured power metallization and extends beyond the first defined edge of the structured power metallization by at least 0.5 microns,
wherein the structured interlayer has a compressive residual stress at room temperature and the structured power metallization generates a tensile stress at room temperature that is at least partly counteracted by the compressive residual stress of the structured interlayer,
wherein the first defined edge of the structured power metallization has a sidewall which slopes inward.

2. The semiconductor device of claim 1, wherein the sidewall of the first defined edge of the structured power metallization slopes inward at an angle greater than 0 degrees and up to 10 degrees relative to a normal line which is perpendicular to a surface of the structured interlayer on which the structured power metallization is disposed.

3. The semiconductor device of claim 1, wherein the barrier comprises one or more of SiN, SiO, SiC, SiCN, AlO, and AlN.

4. The semiconductor device of claim 1, wherein the barrier is a single layer comprising one of SiN, SiO, SiC, SiCN, AlO, or AlN.

5. The semiconductor device of claim 1, wherein the barrier comprises a stack of layers.

6. The semiconductor device of claim 1, wherein the barrier comprises a first SiN layer arranged closest to the structured power metallization, a SiO layer on the first SiN layer, and a second SiN layer on the SiO layer, and wherein the second SiN layer is thicker than the first SiN layer.

7. The semiconductor device of claim 6, wherein the SiO layer is thicker than the first SiN layer and thinner than the second SiN layer.

8. The semiconductor device of claim 6, wherein the SiO layer is at least two times as thick as the first SiN layer, and wherein the second SiN layer is at least three times as thick as the first SiN layer.

9. The semiconductor device of claim 1, wherein the barrier has a generally uniform thickness and conforms to a surface topography of the structured power metallization.

10. The semiconductor device of claim 1, wherein the sidewall of the first defined edge of the structured power metallization has an outward projecting ledge adjacent to the structured interlayer, and wherein the outward projecting ledge has a lateral dimension which is less than half the thickness of the barrier.

11. The semiconductor device of claim 1, further comprising:
an imide on the barrier; and
a molding compound on the imide.

12. A method of manufacturing a semiconductor device, the method comprising:
forming a structured interlayer on a substrate;
forming a structured power metallization on the structured interlayer, wherein a first defined edge of the structured interlayer faces the same direction as a first defined edge of the structured power metallization and extends beyond the first defined edge of the structured power metallization by at least 0.5 microns, wherein the structured interlayer has a compressive residual stress at room temperature and the structured power metallization generates a tensile stress at room temperature that is at least partly counteracted by the compressive residual stress of the structured interlayer;
etching the first defined edge of the structured power metallization so that the first defined edge of the structured power metallization has a sidewall which slopes inward; and
forming a barrier on the structured power metallization, the barrier configured to prevent diffusion of at least one of water, water ions, sodium ions, potassium ions, chloride ions, fluoride ions, and sulphur ions towards the structured power metallization.

13. The method of claim 12, wherein etching the first defined edge of the structured power metallization comprises:
wet chemical etching the first defined edge of the structured power metallization for a duration greater than 20 seconds and so that the sidewall slopes inward at an angle greater than 0 degrees and up to 10 degrees relative to a normal line which is perpendicular to a surface of the structured interlayer on which the structured power metallization is disposed.

14. The method of claim 13, wherein the first defined edge of the structured power metallization is wet chemical etched for up to 90 seconds.

15. The method of claim 12, wherein forming the barrier on the structured power metallization comprises:
depositing one or more of SiN, SiO, SiC, SiCN, AlO, and AlN on the structured power metallization.

16. The method of claim 12, wherein forming the barrier on the structured power metallization comprises:
forming a first SiN layer arranged closest to the structured power metallization;
forming a SiO layer on the first SiN layer; and
forming a second SiN layer on the SiO layer,
wherein the second SiN layer is thicker than the first SiN layer.

17. The method of claim 16, wherein the SiO layer is thicker than the first SiN layer and thinner than the second SiN layer.

18. The method of claim 16, wherein the SiO layer is at least two times as thick as the first SiN layer, and wherein the second SiN layer is at least three times as thick as the first SiN layer.

19. The method of claim 12, wherein the barrier has a generally uniform thickness and conforms to a surface topography of the structured power metallization.

20. The method of claim 12, further comprising:
forming an imide on the barrier; and
molding the semiconductor device with a molding compound which covers the imide.

* * * * *